United States Patent [19]
Holloway et al.

[11] Patent Number: 5,976,681
[45] Date of Patent: Nov. 2, 1999

[54] GIANT MAGNETORESISTORS WITH HIGH SENSITIVITY AND REDUCED HYSTERESIS

[75] Inventors: Henry Holloway, Dearborn; David John Kubinski, Canton, both of Mich.

[73] Assignee: Ford Global Technologies, Inc., Dearborn, Mich.

[21] Appl. No.: 08/884,951

[22] Filed: Jun. 30, 1997

[51] Int. Cl.$^6$ .................................................. G11B 5/66
[52] U.S. Cl. ..................... 428/212; 428/213; 428/611; 428/635; 428/692; 428/694 TM; 428/694 TS; 428/900; 324/252; 360/113; 338/32 R
[58] Field of Search .................... 428/694 TM, 694 TS, 428/212, 213, 611, 635, 692, 900; 324/252; 360/113; 338/32 R

[56] References Cited

U.S. PATENT DOCUMENTS

| | | | |
|---|---|---|---|
| 4,447,839 | 5/1984 | Desserre et al. | 360/113 |
| 4,551,676 | 11/1985 | Amemiya et al. | 324/207.21 |
| 5,140,267 | 8/1992 | Shintaku | 324/248 |
| 5,277,991 | 1/1994 | Satomi et al. | 428/611 |
| 5,313,186 | 5/1994 | Schuhl et al. | 338/32 R |
| 5,341,118 | 8/1994 | Parkin | 338/32 R |
| 5,366,815 | 11/1994 | Araki et al. | 428/611 |
| 5,402,292 | 3/1995 | Komoda et al. | 360/113 |
| 5,422,621 | 6/1995 | Gambino et al. | 338/32 R |
| 5,442,508 | 8/1995 | Smith | 360/113 |
| 5,446,613 | 8/1995 | Rottmayer | 360/113 |
| 5,447,781 | 9/1995 | Kano | 428/212 |
| 5,462,795 | 10/1995 | Shinjo et al. | 428/332 |
| 5,475,304 | 12/1995 | Prinz | 324/207.21 |
| 5,477,582 | 12/1995 | Prinz | 15/231 |
| 5,487,356 | 1/1996 | Li et al. | 117/99 |
| 5,521,501 | 5/1996 | Dettmann et al. | 324/252 |

OTHER PUBLICATIONS

Giant Magnetoresistance of (001) Fe/(001) Cr Magnetic Superlattices, Baibch et al., The American Physical Society, Nov. 21, 1988, pp. 2472–2251.

Giant magnetoresistance in Co/Cu multilayers with very thin Co layers: Reduced hysteresis at the second antiferromagnetic maximum, Kubinski et al., American Institute of Physics, Feb. 1, 1996, pp. 7090–7094.

Giant magnetoresistance in Co/Cu multilayers with Co layers at alternating thicknesses: Reduction of Magnetoresistive hysteresis, Holloway et al., American Institute of Physics, May 1, 1996, pp. 7090–7094.

Giant magnetoresistance in $Co_{1-x}Cu_x$/Cu Multilayers: A New Approach to Reduced Magnetoresistive Hysteresis, Kubinski et al., J. Appl. Phys. 82, Jul. 1, 1997.

Oscillations in Exchange Coupling and Magnetoresistance in Metallic Superlattice Structures: Co/Ru, Co/Cr, and Fe/Cr, Parkin et al., Physical Review Letters, May 7, 1990.

Oscillatory Magnetic Exchange Coupling through Thin Copper Layers, Parkin et al., Physical Review Letters, Apr. 22, 1991.

Oscillatory Interlayer coupling and giant magnetoresistance in Co/Cu multilayers, Schroeder et al., Journal of Magnetism & Magnetic Materials Mar. 1, 1991.

*Primary Examiner*—Leszek Kiliman
*Attorney, Agent, or Firm*—Damian Porcari

[57] ABSTRACT

A magnetoresistive multilayer structure having ferromagnetic layers of Co codeposited with Cu. The codeposited layer has a total thickness between 1 and 20 Å. The volume of Cu in the codeposited layers is between 1% and 120% of the volume of Co. The ferromagnetic layers are separated by layers of Cu. The resulting structure has low magnetoresistive hysteresis.

12 Claims, 6 Drawing Sheets

GIANT MAGNETORESISTORS WITH HIGH SENSITIVITY AND REDUCED HYSTERESIS

BACKGROUND OF THE INVENTION

1. Field of the Invention

The present invention relates to (Co+Cu)/Cu superlattices for use in giant magnetoresistance (GMR) material. More particularly, the present invention relates to a Co–Cu/Cu superlattice in which the Co+Cu layers consist of codeposited Co and Cu.

2. Description of the Related Art.

GMR and materials exhibiting GMR have been used for detecting the magnetic field in magnetic sensors, magnetic heads for computer disks, rotation detectors, position detectors and other types of sensors. The phenomenon of GMR was first identified for multilayer thin films that consisted of thin layers of the ferromagnetic metal Fe separated by a nonferromagnetic Cr metal spacer as described in the paper by M. N. Baibich, J. M. Broto, A. Fert, F. Nguyen Van Dau, F. Petroff. P. Etienne, G. Creuzet, A. Friederich, and J. Chazelas, Phy. Rev. Lett. 61, (21), 2471, Nov. 21, 1988. Although the magnetoresistance in the Fe/Cr multilayers was not known at that time to be an oscillating function of the Cr thickness, the maximum magnetoresistance was obtained with a Cr thickness of 9 Å. This was subsequently shown to be approximately at the first maximum of an oscillating dependence on Cr thickness as described in the paper by S. S. P. Parkin, N. More, and K. P. Roche, Phys. Rev. Lett. 64, (19), 2304, May 7, 1990. A similar oscillating behavior was found with Co/Ru. Later it was found that layers of ferromagnetic Co with Cu spacer layers also showed the effect and that this combination of metals gave a large change of resistivity with a relatively small change of the magnetic field D. H. Mosca, F. Petroff, A Fert, P. A. Schroeder, W. F. Pratt Jr., and R. Loloee, J. Magn. Magn. Mater. 94, L1–L5, Mar. 1, 1991; S. S. P. Parkin, R. Bhadra, and K. P. Roche, Phys. Rev. Lett. 66, (16), 2151, Apr. 22, 1991. The magnetoresistance in this system is an oscillatory function of the thickness of the Cu layers. Maxima that occur with Cu layer thicknesses near 9 Å and near 20 Å are particularly useful. These conditions are commonly referred to as the first and second anti-ferromagnetic maximum (AFM), respectively. In practice, the second AFM gives a larger rate of change of resistivity with change of magnetic field and is, therefore, usually preferred. Typical values of the Co layer thickness are of the order of 10–15 Å.

The physical origin of the phenomenon is the interaction between consecutive Co layers via the Cu spacer layers. With appropriate choice of the Cu spacer thickness (i.e. at an AFM) and in the absence of an applied magnetic field, the magnetizations of adjacent Co layers are aligned antiparallel in consequence of an antiferromagnetic coupling force. This is a relatively high-resistance state. With the application of a magnetic field (preferably in the plane of the film) the magnetizations of the Co layers are made parallel and the resistance decreases. The change in resistivity is largest at the first AFM, but this typically requires a magnetic field of 1–2 kOe. At the second AFM, the field required to overcome the anti-ferromagnetic alignment is substantially smaller so that this condition gives the maximum sensitivity to change of the magnetic field.

A disadvantage of the GMR phenomenon in practical applications is the occurrence of hysteresis. When a material exhibits hysteresis, the maximum resistance does not occur exactly at zero applied field. Instead, the resistance lags behind the applied field. This causes an undesirable uncertainty in the magnetic field that is associated with a particular value of the resistance. As a fraction of the magnetic field required for saturation, the splitting of the Resistivity/Magnetic (RIM) field curve is larger at the second AFM than at the first.

U.S. Pat. No. 5,341,118 ('118), issued Aug. 23, 1994, teaches the use of alternating layers of magnetic and nonmagnetic metals in which the magnetoresistance is an oscillatory function of the thickness of the nonmagnetic metal to detect a magnetic field or changes therein. The combinations that are specified include Co/Cu. However, neither it nor the other art cited addresses the problem of reducing magnetoresistive hysteresis that is described in the '118 patent. FIG. 14 of the '118 patent shows that substantial magnetoresistive hysteresis was seen near room temperature in the Co/Cu multilayers.

It was found that the magnetoresistive hysteresis of Co/Cu multilayers could be reduced by making the Co layers very thin (<4 Å) as discussed in Giant magnetoresistance in Co/Cu multilayer with very thin Co layers: Reduced hysteresis at the second antiferromagnetic maximum. D. J. Kubinski and H. Holloway, J. Appl. Phys. 79 (3), Feb. 1, 1996, and incorporated herein by reference. The physical state of the thin Co layers is not well defined and is specified by an average thickness. The actual thickness is physically limited to multiples of discrete spacings of the crystal lattice of Co, which are of the order of 2 Å. Thus, the average thicknesses of the very thin polycrystalline Co layers, which are of the order of 3 Å, arises from closely intermixed regions with significantly varied thicknesses. While not wishing to be bound to this theory, it is believed that the very thin Co layers are broken up into closely spaced isolated islands.

It was found that the hysteresis is greatly reduced when the average Co thickness is less than 6 Å and that it is nearly eliminated with an average Co thickness of 3 Å. With the 3 Å thick Co layers, the magnetoresistance is somewhat smaller than with 15 Å thick Co layers, but this is substantially offset by a narrower peak in the Resistivity/Magnetic field curve. Consequently, the sensitivity to changes in the magnetic field remains large. The maximum slope of the Resistivity/Magnetic field curve gives a sensitivity of:

$$S=(1/R)(dR/dH)\approx 0.7\times 10^{-3} Oe^{-1}$$

for the 3 Å thick Co layers, compared with:

$$S\approx 1.2\times 10^{-3} Oe^{-1}$$

for the 15 Å thick Co layers. With further reduction of the average Co thickness to 1 Å the magnetoresistance is decreased to less than 1%.

It was also found that hysteresis can be reduced in the superlattices (particularly of Co/Cu) in which some of the ferromagnetic layers (e.g. Co) are made very thin. In Giant magnetoresistance in Co/Cu multilayers with Co layers of alternating thicknesses: Reduction of magnetoresistive hysteresis. H. Holloway and D. J. Kubinski, J. Appl. Phys. 79 (1), May 1, 1996, incorporated herein by reference, the authors describe the magnetoresistive properties of Co/Cu multilayers in which the thicknesses of anti-ferromagnetically coupled, Co layers are alternated between thicker and thinner values. In such structures the thicker Co layers become coupled more strongly to applied magnetic fields than are the thinner Co layers. Such structures combine the large magnetoresistance of Co layers with conventional thickness of ~15 Å with the small hysteresis of Co layers that have thicknesses ~3 Å.

In an article by the inventors of the present invention, Giant magnetoresistance in $Co_{1-x}Cu_x/Cu$ multilayers: A new approach to reduced magnetoresistive hysteresis, D. J. Kubinski and H. Holloway, to be published in J. Appl. Phys. 82, (1) Jul. 1, 1997, and incorporated herein by reference, the authors describe the properties of the multilayers incorporating Co+Cu alloy layers that are the subject of this invention. As will be shown, this provides a new and useful method for obtaining giant magnetoresistance with greatly reduced magnetoresistive hysteresis.

SUMMARY OF THE INVENTION

The present invention relates to a magnetoresistive multilayer structure incorporating layers of Co codeposited with Cu. Two or more of such codeposited layers are separated by Cu spacer layers. Typically the codeposited layers consist of 1–10 Å of Cu with the addition of Cu equivalent to 5–120% of the Co thickness. The Cu thickness is chosen to correspond to an AFM, preferably the second AFM at approximately 20 Å.

It was found that the magnetoresistive hysteresis of Co/Cu multilayers could be greatly reduced by replacing the Co layers with a codeposited Co+Cu alloy. The physical state of the codeposited Co+Cu layers is not well defined and may be specified by the equivalent thickness of each constituent. While not wishing to be bound by the following theory, it is believed that some of the Co is segregating into closely spaced isolated islands.

The primary objective of the present invention is to extend the range of ferromagnetic layer thicknesses over which reduced magnetoresistive hysteresis is obtained. The requirement of very thin ferromagnetic Co layers (in the range 2–3 Å) for low-hysteretic behavior as described in the previous references may be difficult to maintain consistently in a production environment. In contrast, by using ferromagnetic layers that consist of codeposited Co+Cu, substantially reduced hysteresis may be obtained with ferromagnetic layer thicknesses over at least the range 6–15 Å with approximately equal contents of Co and Cu. These less severe requirements on the total ferromagnetic layer thickness make possible a more robust manufacturing process. None of the related art exhibits simultaneously the following advantages of the present invention: high sensitivity, low hysteresis, and insensitivity to the thickness of the ferromagnetic layers.

Further objects and advantages of the present invention will become more apparent from the following description in reference to the attached drawings.

DETAILED DESCRIPTION OF THE PREFERRED EMBODIMENTS

Example 1

Figure 1:
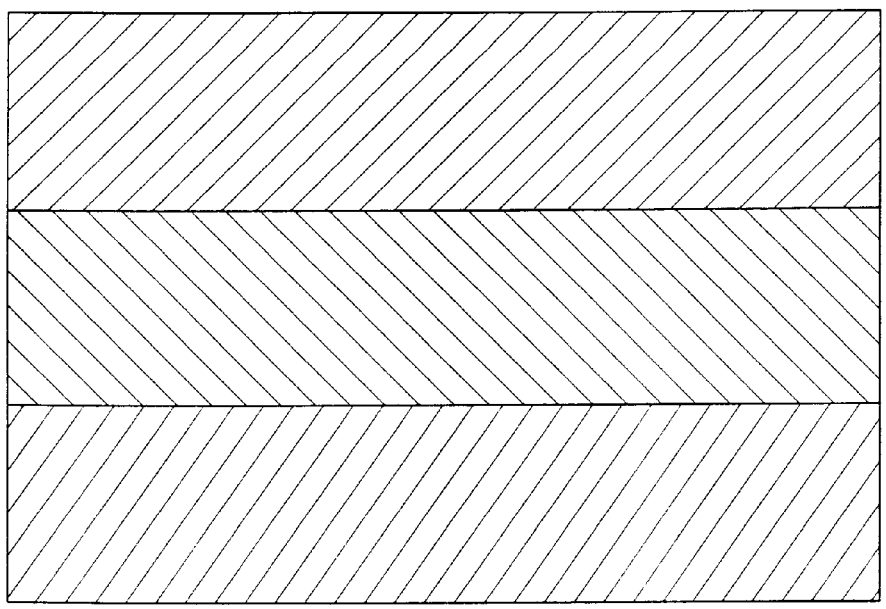
FIG. 1 is a schematic representation of a multilayer structure in which layers of codeposited Co+Cu are separated by layers of Cu.

The preferred embodiment for a hysteresis-free, high sensitivity film is detailed in the following description: Alternating layers of a ferromagnetic codeposited Co+Cu layer and a 20 Å Cu spacer layer are deposited on an oxidized Si substrate. More preferred, but not required include using a 75 Å buffer layer interposed between the oxidized Si and the Co+Cu and Cu layers. The deposition of the Co+Cu/Cu pair of layers is repeated 20 times. The composition of the codeposited layer corresponds to 5 Å of Co plus 4.5 Å of Cu. Deposition is effected by sputtering using 2 to 3 mTorr of Ar in a vacuum chamber with a base pressure of approximately $10^{-8}$ Torr. The Cu layers are deposited at approximately 4 Å/s and the Co in the Co+Cu layers is deposited at approximately 2.4 Å/s simultaneously with Cu deposited at a rate that is adjusted to give the desired Co+Cu composition. The thickness of the Co+Cu codeposited layers is in the range 6 to 12 Å and the thickness of the Cu layers is approximately 20 Å, corresponding to the 2nd AFM.

Example 2

Example 2 is the same as Example 1, except that every other ferromagnetic codeposited Co+Cu layer is replaced with a Co layer with thickness in the range 10 to 30 Å.

Example 3

Example 3 is the same as Example 1, except that the 20 Å Cu spacer layers are replaced with approximately 9 Å Cu spacer layers. The approximately 9 Å Cu spacer layers corresponds to the 1st AFM.

Example 4

Example 4 is the same as Example 2, except that the 20 Å Cu spacer layers are replaced with approximately 9 Å Cu spacer layers. The approximately 9 Å Cu spacer layers corresponds to the 1st AFM.

The measurement that is most useful to quantify the amount and character of the hysteresis in a structure is the dependence of the magnetoresistance on the magnetic field as the magnetic field is cycled between extreme positive and negative values.

The phrase 'reduced hysteresis' as used herein relates to a comparison between the properties of a structure of the present invention to that of a structure having Co layers of conventional thickness (10 Å or more) separated by Cu spacer layers with thickness approximately 20 Å, corresponding to the second AFM.

Figure 2:
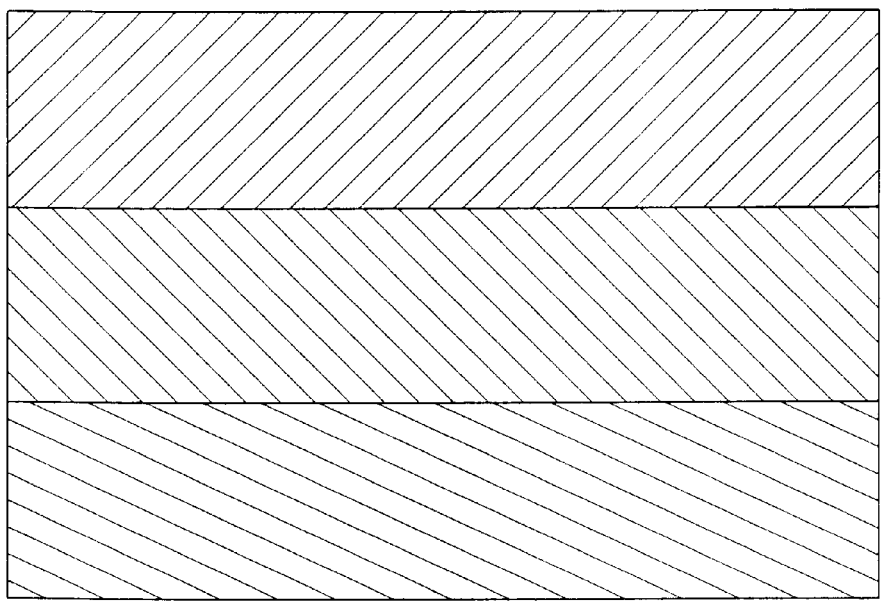
FIG. 2 is a schematic representation of a multilayer structure in which layers of codeposited Co+Cu are alternated with layers of Co with separation by layers of Cu.

Illustrated in FIG. 1 is the basic structure of the present invention. Two thin layers of codeposited Co+Cu are separated by a thin layer of Cu. In practice, better results are obtained with a larger number of Co layers and our typical structures have 20 Co+Cu layers, but this number is not critical. FIG. 2 shows a variation on this structure, wherein Co+Cu ferromagnetic layers are alternated with Co ferromagnetic layers, but still with Cu separator layers. Again, it is preferred to use a larger number of ferromagnetic layers, but the invention allows fewer layers.

Figure 3:
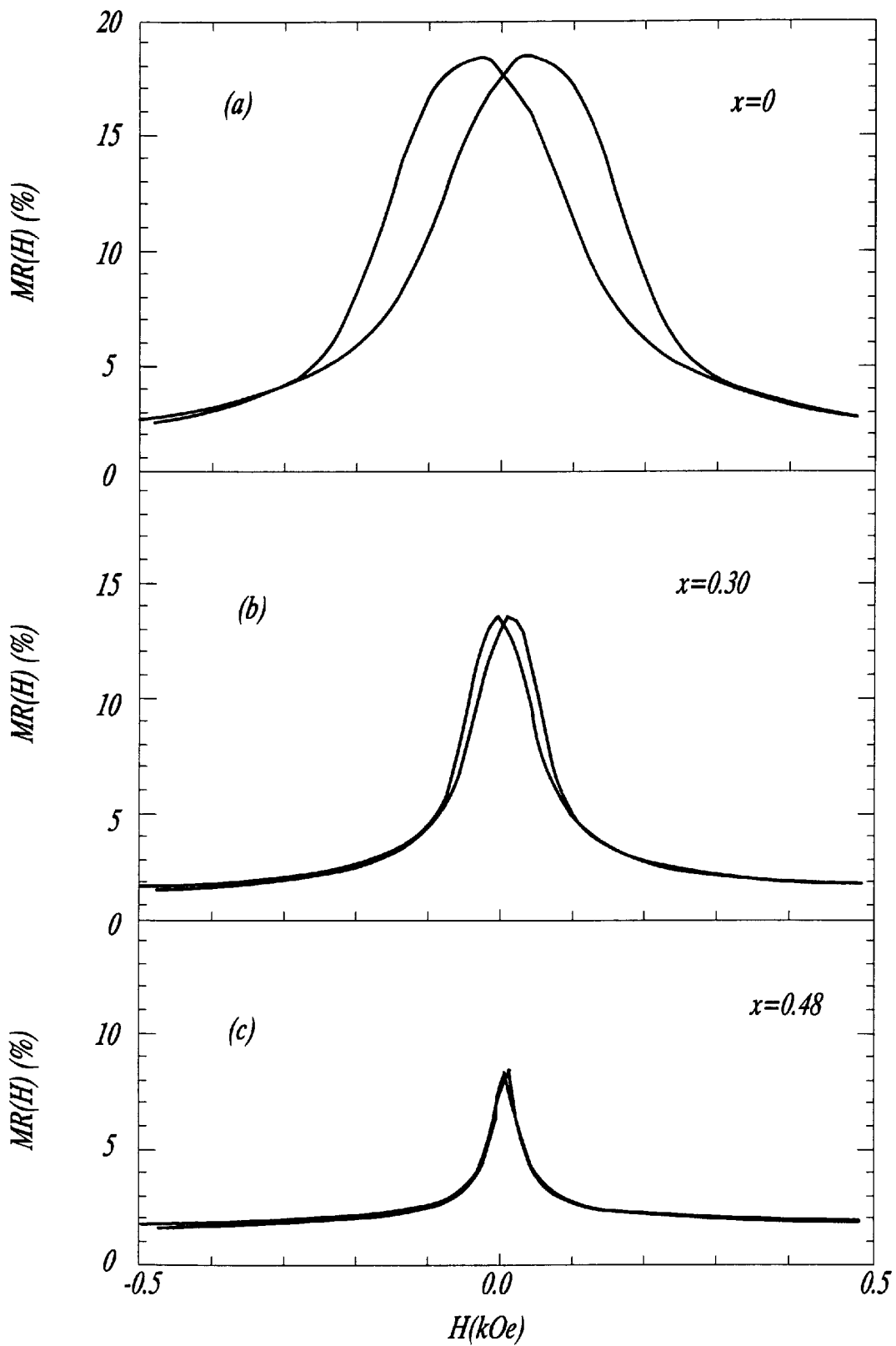
FIG. 3 is a graph of room-temperature magnetoresistance of multilayers $[Co_{1-x}Cu_x/Cu(20 \text{ Å})]_{20}$ with varying mole fractions (x) of Cu.

FIG. 3 shows the effect on the MR/H curves of increasing the amount of Cu which is codeposited with 5 Å of Co. The Co thickness, $t_{Co}$ was 5.5 Å. The thickness of the Cu spacer between the codeposited Co–Cu layer is held constant at 20 Å (i.e. at the second AFM). The measurements were made at room temperature. The hysteresis is greatly reduced when 2.4 Å Cu is codeposited with 5 Å Co, and it practically vanishes when 5 Å Cu is codeposited with the 5 Å of Co. With the [5 ÅCo–5 Å Cu] codeposited layers, the magnetoresistance is smaller than with 5 Å —thick Co layers, but this is largely offset by a narrower peak in the MR/H curve. Consequently, the sensitivity to changes in the magnetic field remains large. The maximum slope of the MR/H curve gives a sensitivity represented by the equation below:

$$S=(l/R)(dR/dH)\approx 1.2\times 10^{-3} Oe^{-1}$$

for the [5 Å Co–5 Å Cu] codeposited layers. This is nearly the same sensitivity as seen in conventional Co/Cu MLs.

Figure 4:
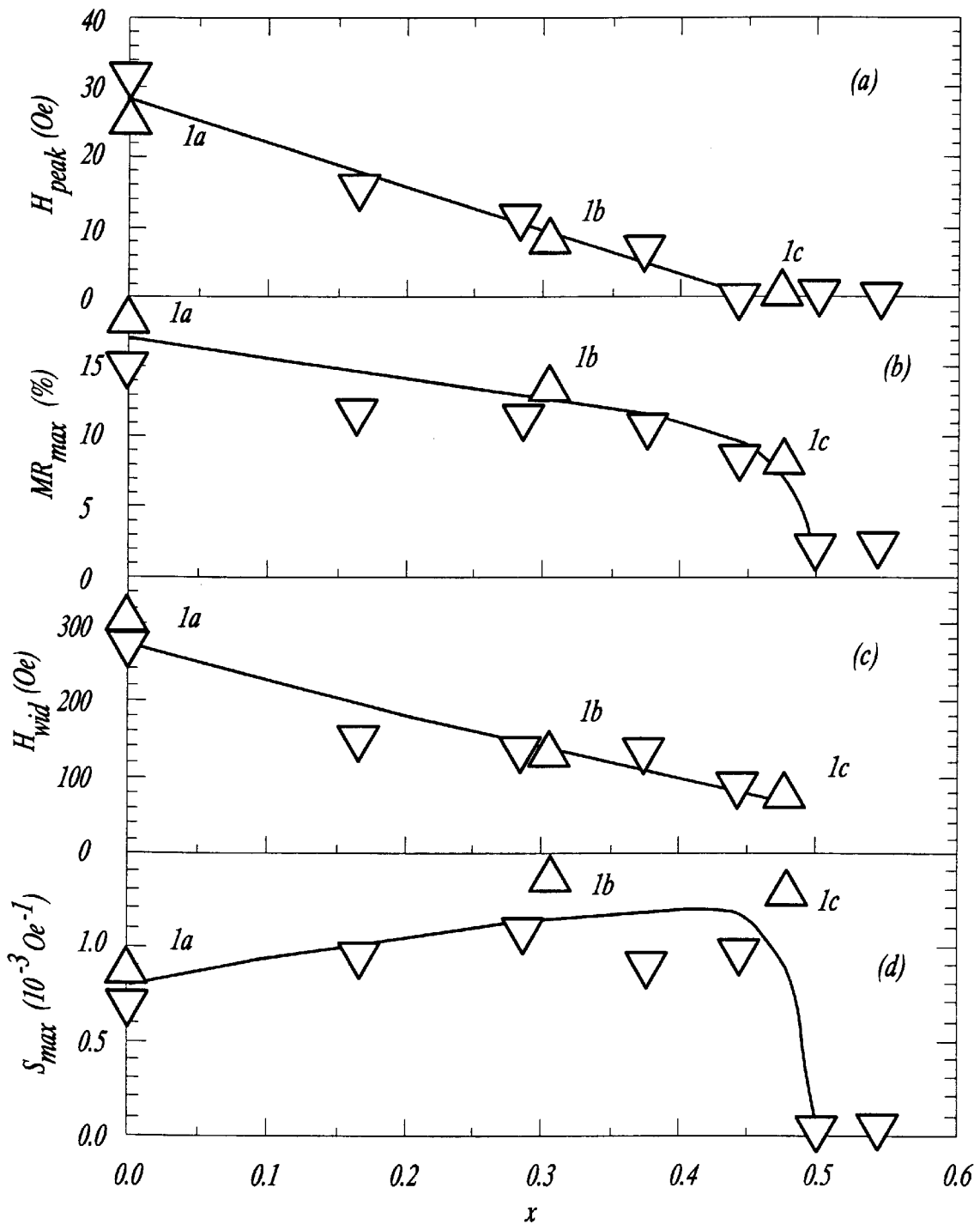
FIG. 4 is a graph of the dependence of room temperature properties on the mole fraction, x, of Cu in the codeposited Co+Cu layer

FIGS. 4a–d illustrates the dependence of room temperature properties on the mole fraction, x, of Cu in the codeposited Co+Cu layer. The symbols Δ are for specimens with $t_{Co}$=5.5 Å and ∇ are for $t_{Co}$=5.0 Å. The three points identified as 1a–1c correspond to the specimens for which data are shown in FIGS. 3a–3cl. FIG. 4a is the displacement of the peaks in the R/H curves from zero field. FIG. 4b is the magnetoresistance at the peak of the R/H curves. FIG. 4c are the widths of the peaks in the R/H curves. FIG. 4d are the sensitivities.

Figure 5:
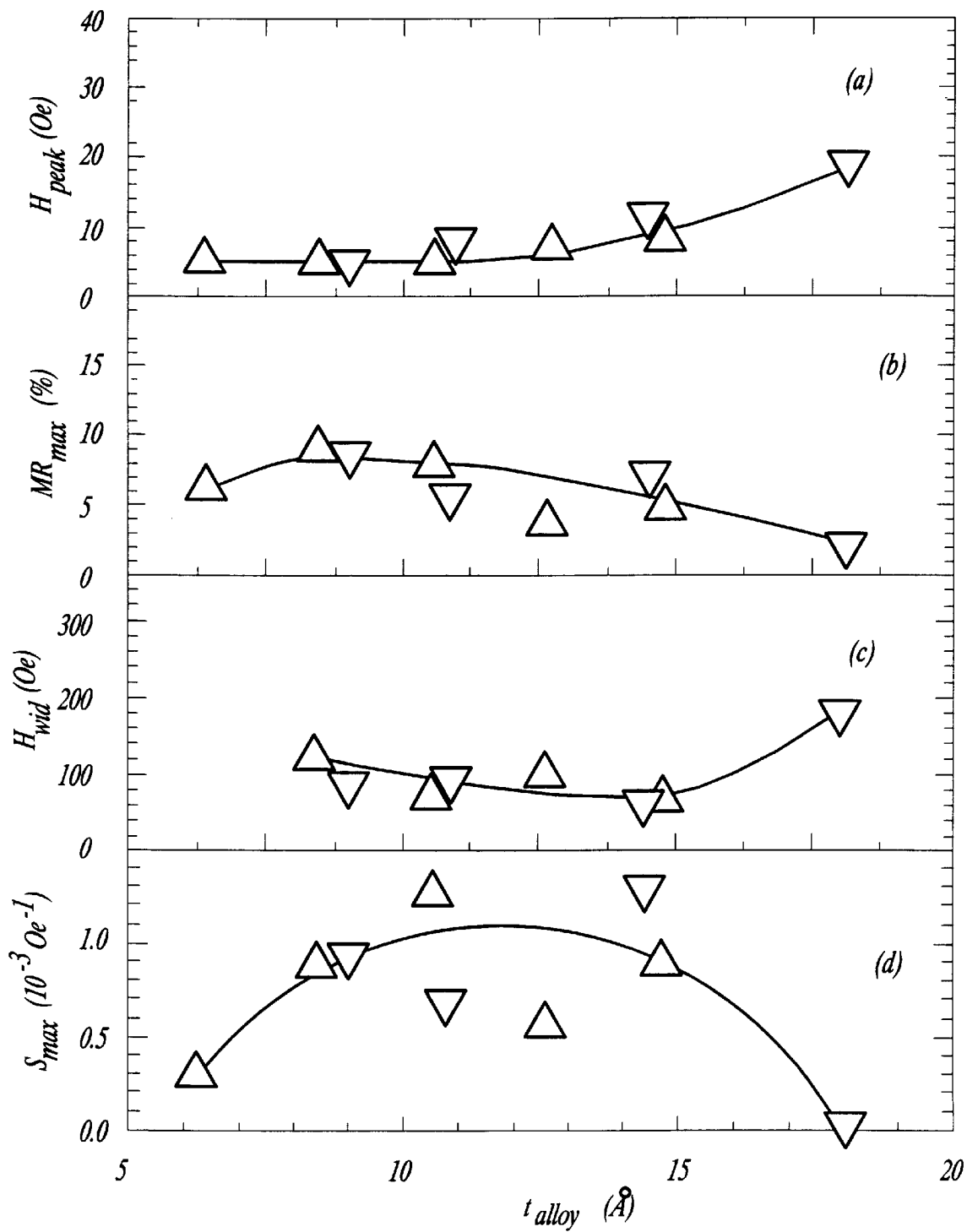
FIG. 5 is a graph of the dependence of room temperature properties on the total thickness of the codeposited layer, $t_{alloy}$ for specimens with x≈0.5.

FIGS. 5a–d illustrate the dependence of room temperature properties on the total thickness of the codeposited layer, $t_{alloy}$ for specimens with x≈0.5. The symbols Δ are for x=0.48 with $t_{Co}$=5.5 Å and ∇ are for x=0.44 with $t_{Co}$=5.0 Å. FIG. 5a is the displacement of the peaks in the R/H curves from zero field. FIG. 5b is the magnetoresistance at the peak of the R/H curves. FIG. 5c are the widths of the peaks in the R/H curves. FIG. 5d are the sensitivities.

As shown in FIG. 5(a), nearly hysteresis free MR/H curves are observed when equal thicknesses of Co and Cu are codeposited, to give total ferromagnetic layer thicknesses in the range 6–12 Å and useful properties are observed out to a total codeposit thickness up to 18 Å. Increasing the total thickness much beyond about 18 Å or increasing the mole fraction of Cu in the codeposit much beyond 0.5 causes a loss of the useful properties.

Figure 6:
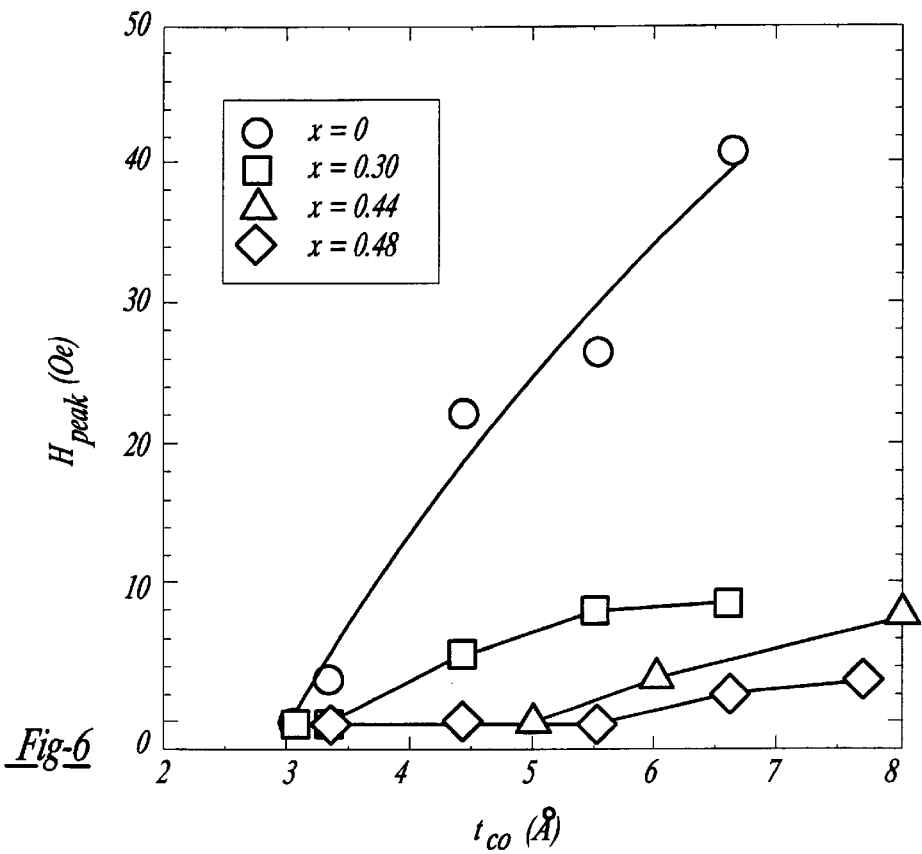
FIG. 6 is a graph of the dependence of room temperature on the displacement of the peaks in the R/H curves from zero field, $H_{peak}$ on $t_{Co}$ for several mole fractions of Cu.

Illustrated in FIG. 6 is the room temperature dependence of the displacement of the peaks in the R/H curves from zero field, $H_{peak}$ on $t_{Co}$ for several mole fractions of Cu. FIGS. 3 and 6 show that the most useful results are obtained with codeposit layers in which the mole fraction of Cu, x, is between 0.3 and 0.5.

Figure 7:
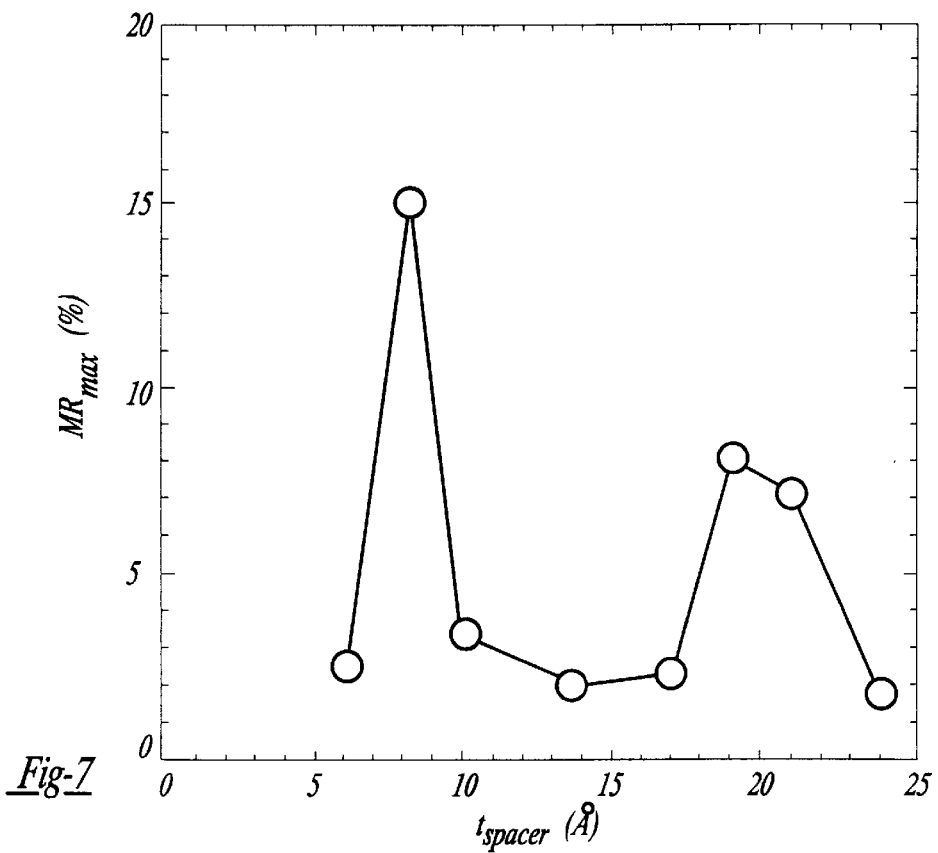
FIG. 7 is a graph of the dependence of room temperature on the maximum magnetoresistance, $MR_{max}$, of the copper spacer layer thickness, $t_{spacer}$, with specimens that have constant x=0.48 and $t_{alloy}$=11.5 Å ($t_{Co}$=5.5 Å).

Illustrated in FIG. 7 is the room temperature dependence of maximum magnetoresistance, $MR_{max}$, on the copper spacer layer thickness, $t_{spacer}$, with specimens that have constant x=0.48 and $t_{alloy}$=11.5 Å ($t_{Co}$=5.5 Å). FIG. 7 shows how the maximum magnetoresistance varies with the thickness of the Cu spacer layer. Two well-defined peaks are observed at spacer thicknesses of approximately 8 Å and 20 Å, respectively. These correspond to the 1st and 2nd antiferromagnetic maxima. The preferred embodiment uses the 2nd antiferromagnetic maximum, but operation at the 1st maximum is also possible.

Figure 8:
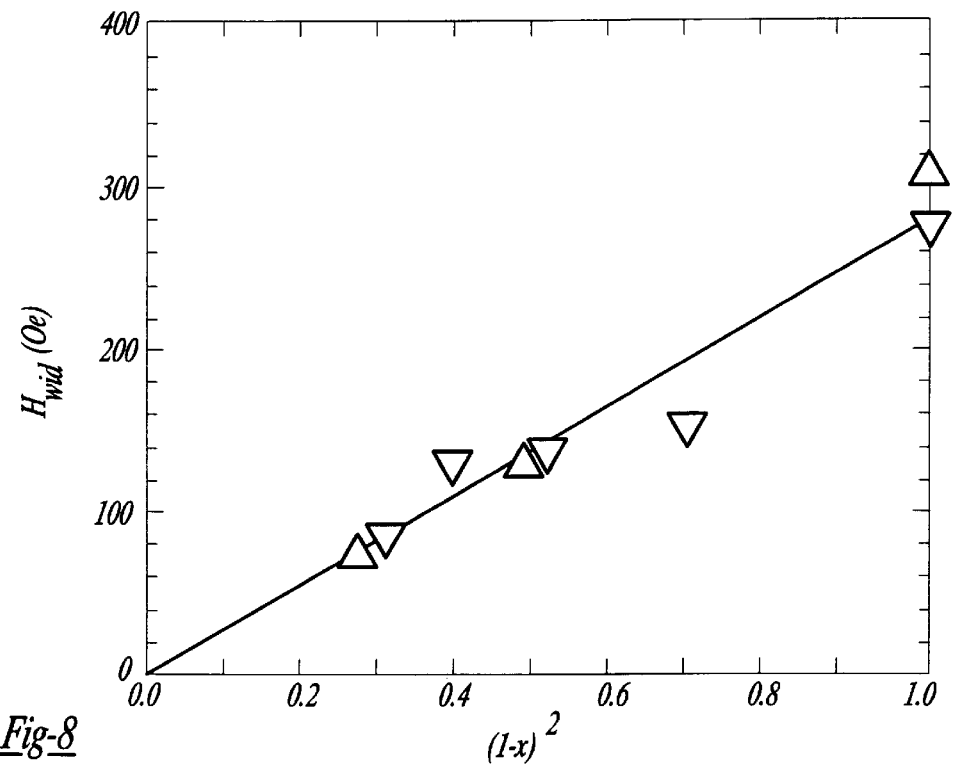
FIG. 8 is a graph of the dependence of room temperature on the width of the R/H peak, $H_{wid}$, of the square of the mole fraction of Co in the alloy layers, $(1-x)^2$.

Illustrated in FIG. 8 is the room temperature dependence of the width of the R/H peak, $H_{Wid}$, on the square of the mole fraction of Co in the alloy layers, $(1-x)^2$. The symbols Δ are for specimens with $t_{Co}$=5.5 Å. and ∇ are for $t_{Co}$=5.0 Å. The width of the peak in the R/H curve, $H_{Wid}$, varies as the square of the mole fraction of Co, (1–x), in the codeposit.

Figure 9:
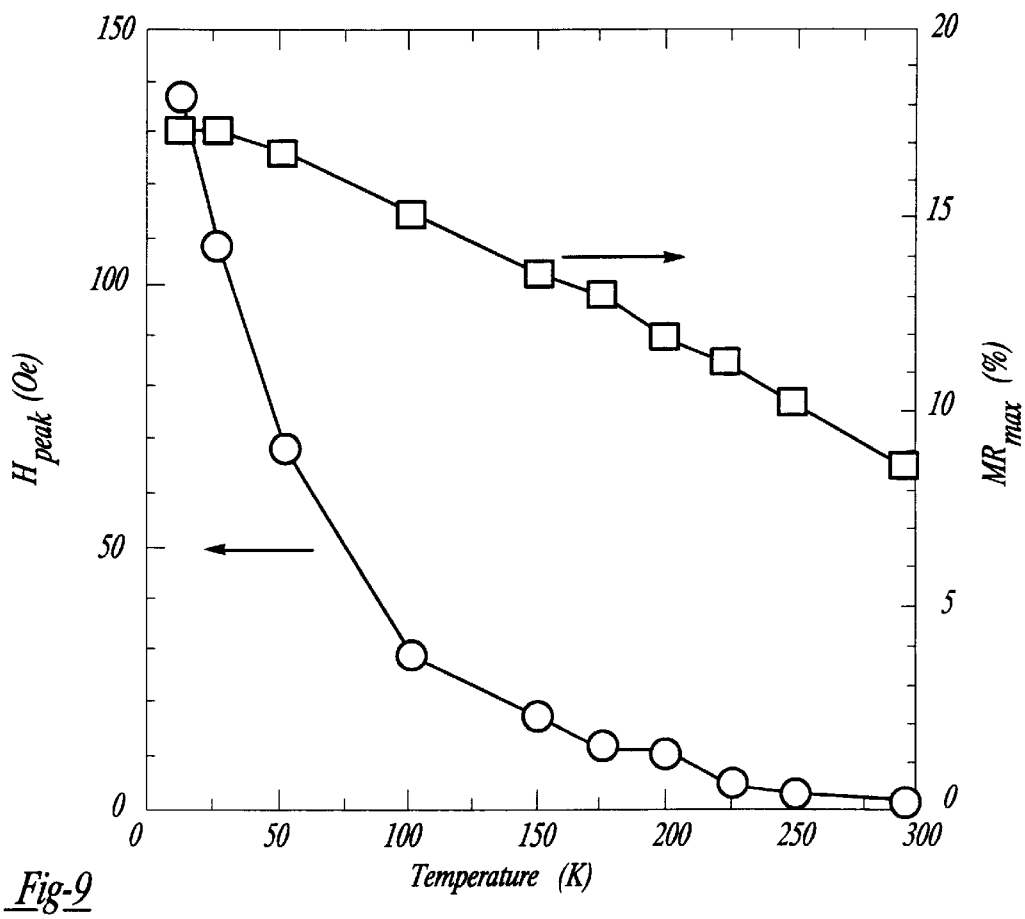
FIG. 9 is a graph of the dependence of temperature on the $H_{peak}$ and $MR_{max}$ for a multilayer with x=0.48 and $t_{alloy}$=11.5 Å ($t_{Co}$=5.5 Å).

Illustrated in FIG. 9, is the temperature dependence of $H_{peak}$ and $MR_{max}$ for a multilayer with x=0.48 and $t_{alloy}$=11.5 Å ($t_{Co}$=5.5 Å). This is the specimen whose field-dependent magnetoresistance at room temperature is shown in FIG. 3c. The hysteresis reappears if the structures are cooled below room temperature.

In an alternative embodiment of the present invention, low hysteresis codeposited material as described above may also be used in an alternating thick-thin structure that was outlined in commonly assigned U.S. patent application Ser. No. 08/707,836 titled: Giant Magnetoresistors with High Sensitivity and Reduced Hysteresis, and hereby incorporated herein by reference. The very thin Co layers described therein are replaced with codeposited Co+Cu, as shown in FIG. 2. This configuration combines the reduced hysteresis from the codeposited layers with the larger magnetoresistance that is characteristic of the more conventional ferromagnetic layer thickness. In variations on the thick-thin device that is described above, the Co layers may be replaced with other ferromagnetic materials, such as Co+Fe or Ni+Fe alloys.

In other variations of our invention the ferromagnetic codeposited Co+Cu layers of all of the preceding examples may be replaced with ferromagnetic codeposited Co+Fe+Cu alloys.

The present invention, therefore, is well adapted to fulfill the objects, features and advantages outlined above as well as others that are inherent therein. While the invention is been illustrated by its preferred embodiments, other embodiments of the present invention are also possible and are intended to be covered within the spirit and scope of the attached claims.

What is claimed:

1. A magenetoresistive multi-layer structure having high sensitivity and low hysteresis comprising:

two or more ferromagnetic layers in which consecutive ferromagnetic layers are separated by nonmagnetic metallic spacer layers, at least one of said ferromagnetic layers being a codeposit comprised cf Co in amount equivalent to a thickness between 1 and 20 Å and Cu an amount corresponding to a thickness equivalent to between 1% and 120% of the Co and said non-ferromagnetic spacer layer having a thickness chosen to be approximately at an antiferromagnetic maximum, said structure having a room temperature hysteresis of less than 15 $H_{peak}$ Oe).

2. The multilayer structure of claim 1, wherein the spacer layer is selected from the group comprising of Cu, Ag and Cr.

3. The multilayer structure of claim 2, wherein the spacer layer is Cu with a thickness between 17 and 23 Å and corresponding to the 2nd antiferromagnetic maximum.

4. The multilayer structure of claim 3, wherein the spacer layer has a thickness of approximately 20 Å.

5. The multilayer structure of claim 2, wherein the spacer layer is Cu with a thickness between 7 and 11 Å and corresponding to the first antiferromagnetic maximum.

6. The multilayer structure of claim 5, wherein the spacer layer has a thickness of approximately 9 Å.

7. The multilayer structure of claim 1, wherein the Cu in the codeposited ferromagnetic layer is present in an amount corresponding to a thickness equivalent to between 30% and 110% that of the Co.

8. The multilayer structure of claim 1, wherein said codeposited Co+Cu ferromagnetic layers are alternated with ferromagnetic layers of another material.

9. The multilayer structure of claim 8, wherein said codeposited Co+Cu ferromagnetic layers are alternated with ferromagnetic layers of Co.

10. The multilayer structure of claim 8, wherein said codeposited Co+Cu ferromagnetic layers are alternated with ferromagnetic layers of an alloy of Fe and Ni.

11. The magenetoresistive multilayer structure of claim 1, wherein said codeposit ferromagnetic layer has a codeposit of Co in an amount equivalent to a thickness of about 5 Å.

12. The magenetoresistive multilayer structure of claim 1, wherein both of said ferromagnetic layers are a codeposit of Co and Cu.

\* \* \* \* \*